United States Patent [19]

Harrison

[11] 4,152,680

[45] May 1, 1979

[54] BROADBAND FREQUENCY DIVIDER USING MICROWAVE VARACTORS

[75] Inventor: Robert G. Harrison, Montreal, Canada

[73] Assignee: Her Majesty the Queen in right of Canada, as represented by the Minister of National Defence, Canada

[21] Appl. No.: 824,230

[22] Filed: Aug. 12, 1977

[30] Foreign Application Priority Data

Oct. 28, 1976 [CA] Canada .................................. 264358

[51] Int. Cl.[2] .............................................. H01P 1/20
[52] U.S. Cl. ...................................... 333/246; 333/26; 363/158
[58] Field of Search ................ 333/83 R, 97 R, 84 M, 333/26; 307/320; 328/25; 331/177 V; 325/445, 446; 363/158

[56] References Cited

U.S. PATENT DOCUMENTS

| | | |
|---|---|---|
| 3,307,099 | 2/1967 | Weller et al. .................. 333/83 R X |
| 3,400,322 | 9/1968 | Habra ................................ 307/320 X |
| 3,571,722 | 3/1971 | Vendelin .............................. 325/445 |
| 3,678,395 | 7/1972 | Hunton et al. ........................ 325/446 |
| 3,835,421 | 9/1974 | De Brecht et al. ..................... 333/26 |

Primary Examiner—Paul L. Gensler
Attorney, Agent, or Firm—Stevens, Davis, Miller & Mosher

[57] ABSTRACT

A broad band frequency divider in which microstrip or stripline transmission lines and more than one microwave varactor diodes are interconnected to form a circuit which is resonant at a frequency of one-half of the input signal frequency and whose output consists substantially of odd order harmonics of one-half of the input frequency, the even order harmonics being virtually eliminated. An unbalanced output signal is achieved through the use of a coplanar balun. An optional DC external bias may be applied to the varactor diodes.

24 Claims, 26 Drawing Figures (GROUND POTENTIAL)

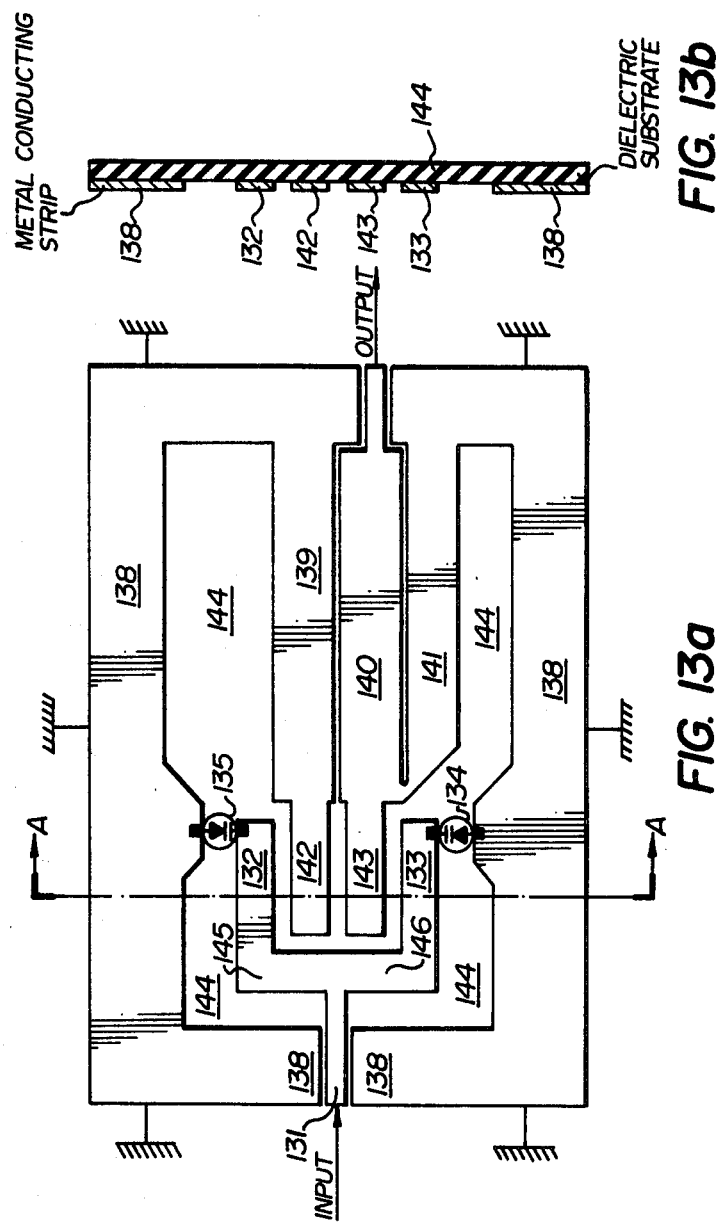

BROADBAND FREQUENCY DIVIDER USING MICROWAVE VARACTORS

BACKGROUND OF THE INVENTION

A. Field of the Invention

This invention relates to a broad band frequency divider using varactor diodes which operate at microwave frequencies.

B. Description of the Prior Art

The existing literature on varactor diode frequency dividers is mainly concerned with their use as computer logic elements. The basic patent is U.S. Pat. No. 2,815,488 which issued to Von Neumann on 3 Dec., 1957. However, this patent deals with a lumped circuit realization of a subharmonic generator. Furthermore, Von Neumann's application is not for broad band frequency dividers but rather for the use of a subharmonic generator as a computer element. In addition, Von Neumann contemplates operating the nonlinear device in a small signal fashion about its equilibrium state.

A microstrip subharmonic generator using a single varactor diode was described by Sterzer in "Microwave Parametric Subharmonic Oscillators For Digital Computing", Proceedings of the IRE, Volume 47, No. 8, August 1959, pages 1317-1324. In this reference, the input and output frequencies were 4 GHz and 2 GHz which are less than the frequencies encountered in the invention described herein. Also, the bandwidth was not reported. Sterzer's circuit has an output signal which contains harmonics of all orders of the desired output signal. The present invention eliminates this last problem substantially.

Onyshkevych, Kosonocky and Lo described a varactor diode subharmonic generator in the same frequency range as Sterzer and achieved an octave bandwidth. Again, a computer application was the purpose of this investigation which is reported in an article entitled "Parametric Phase-Locked Oscillator — Characteristics and Applications to Digital Systems", IRE Transactions on Electronic Computers, Volume EC-8, No. 3, September 1959, pages 277-286.

Finally, the inventor (as mentioned hereinafter) performed a theoretical analysis of a lumped element version of a broad band frequency divider in "Steady-State and Transient Phenomenon in Parametric Subharmonic Oscillators" a Doctoral Thesis by R. G. Harrison for the Imperial College of Science and Technology, University of London, London, England in July, 1964. The inventor also reported the experimental results of an investigation into the steady-state and transient behaviour of two different types of subharmonic oscillator in the above-mentioned reference. However, microwave frequency ranges were not contemplated.

SUMMARY OF THE INVENTION

The broad band frequency divider using microwave varactor diodes according to the present invention is characterized by the fact that the basic subharmonic resonant microwave circuit may consist of a microstrip or stripline transmission lines connected to two microwave varactor diodes to form a bridge network. It is expected that some other even number of varactor diodes could be similarly connected to achieve similar results. This circuit, hereinafter referred to as the basic resonant circuit, performs the frequency division function. The input signal may be introduced by way of a stripline or microstrip transmission line. An unbalanced output is attained by coupling the balanced output signal of the basic resonant circuit to a co-planar balun. The varactors may, optionally, be DC biased.

Some of the achieved objects of this invention are:
1. Broad band frequency division by two. Fractional bandwidths up to 54% have been observed.
2. Good response to pulsed RF input signals.
3. A balanced circuit arrangement which provides:
   (i) isolation between input frequency f and output frequency f/2, and
   (ii) virtual elimination of even order harmonics of the output signal frequency of f/2, depending on the balance achieved.

This avoids the use of separate filters which might otherwise degrade performance under conditions of pulsed RF input signals.

4. The device can operate without any external DC bias supply.
5. There is a pronounced threshold input power level below which the device does not operate.
6. Both the input and output terminals are unbalanced ports, which facilitates the connection of the device into a conventional 50 ohm microwave system.

There are many applications for a microwave frequency divider of the type described herein. Evidently, division by 4, 8, 16 etc. may be obtained by placing several divide-by-two devices in series. An amplifier must be placed in front of each divide-by-two device to compensate for the loss. For example, in radar electronic countermeasures, microwave broad band frequency dividers may be employed to reduce the frequency of a given signal to the frequencies at which surface acoustic wave delay lines operate for further signal processing. Another, and obvious application is a microwave frequency counter. Once again, an appropriate number of frequency dividers are placed sequentially between the signal whose frequency is to be counted and a conventional frequency counter. Lastly, frequency dividers will be applicable to phase locked loop devices.

BRIEF DESCRIPTION OF THE DRAWINGS

FIG. 13(a) is a schematic plan view of a speculative alternative of a frequency divider, following the general teachings presented herein.

FIG. 13(b) is a schematic cross-sectional view of the frequency divider of FIG. 13(a) along line A—A.

DETAILED DESCRIPTION WITH REFERENCE TO THE DRAWINGS

The broad band frequency divider operates in the microwave frequency range and employs (1) stripline or microstrip transmission lines, (2) balanced varactor diodes and (3) a co-planar balun. Each of the component parts of the broad band frequency divider will be described before discussing the operation of the frequency divider itself.

This invention consists essentially of a basic resonant circuit which has two or more transmission lines; each such line being terminated with a varactor diode at one end of the line. The lines are electrically connected or electromagnetically coupled at the other end. The diodes are selected so as to be matched. Means are provided for introducing a signal to the basic resonant circuit and for extracting an output signal from the circuit.

Figure 1A:
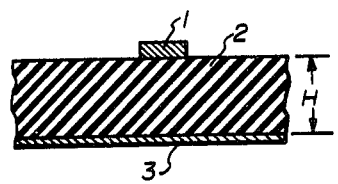
FIG. 1(a) is a schematic cross-sectional view of a microstrip line.
Figure 1B:
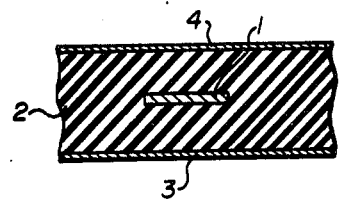
FIG. 1(b) is a schematic cross-sectional view of a stripline.
Figure 1C:
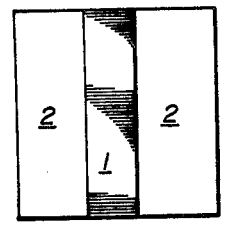
FIG. 1(c) is a schematic plan view of a one-conductor microstrip transmission line.

FIG. 1(a) illustrates a cross-sectional view of a microstrip transmission line. In FIG. 1(b), a stripline is also shown in a cross-sectional view. The microstrip transmission line of FIG. 1(a) consists of a metal conducting strip 1 which is placed upon a dielectric substrate 2. The dielectric substrate 2 often consists of alumina. On the other side of the dielectric substrate 2 away from the conducting strip 1 is a metal ground plane 3. A plan view of the microstrip line is shown in FIG. 1(c) which depicts the substrate 2 and conducting strip 1. Turning now to FIG. 1(b), the stripline is basically a microstrip transmission line with an additional ground plane placed above the conducting strip which is embedded in the dielectric substrate. Numeral 1 denotes a conducting strip which is located in the dielectric substrate 2. The ground planes 3 and 4 are located on both sides of the substrate 2.

Figure 1D:
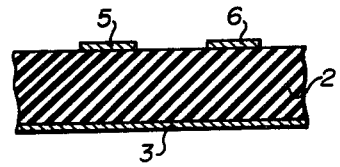
FIG. 1(d) is a schematic cross-sectional view of two microstrip transmission lines.
Figure 1E:
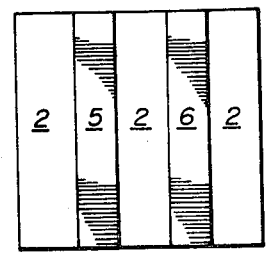
FIG. 1(e) is a schematic plan view of the microstrip transmission lines of FIG. 1(d).

There is no necessity that only one conducting strip be employed in either a microstrip or stripline transmission line. FIG. 1(d) illustrates a cross-sectional view of a microstrip transmission line with two conducting strips 5 and 6. There are now two transmission lines. Hereafter, each such line will be referred to by the numeral which indicates its conducting strip. For example, in FIG. 1(d) the transmission line consisting of the conducting strip 5, dielectric substrate 2 and ground plane 3 will be referred to as transmission line 5 or line 5. FIG. 1(e) is similar to FIG. 1(c) and illustrates a plan view of the microstrip lines 5 and 6. Obviously, a plan view of a stripline would not be of much usefulness. Note that the same scheme of designation used for microstrip lines will also be employed for stripline.

In the following paragraphs, the discussion will be restricted to microstrip or stripline transmission lines. However, the broad band frequency divider could also be constructed using other types of transmission lines.

Figure 2A:
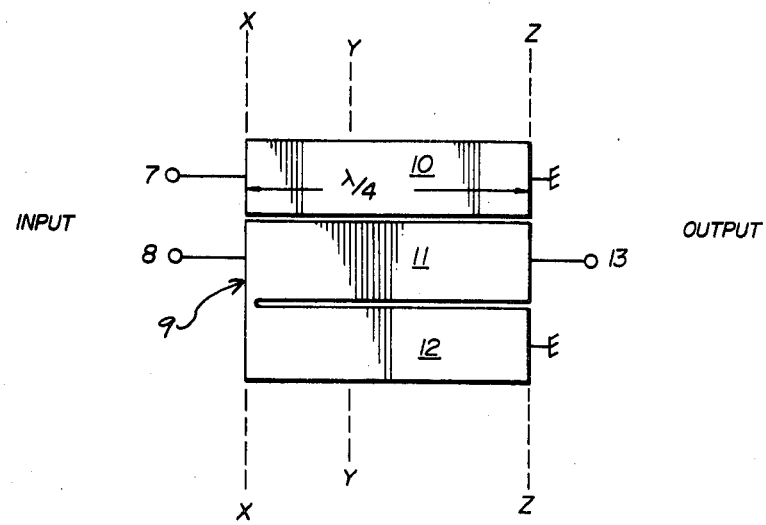
FIG. 2(a) is a schematic plan view of a co-planar balun.
Figure 2B:
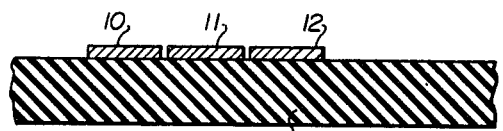
FIG. 2(b) is a schematic cross-sectional view taken along line Y—Y of the co-planar balun of FIG. 2(a).

A second component of the broad band frequency divider is a co-planar balun which converts a balanced input signal to an unbalanced output signal or vice versa. (The underlining indicates the source of the word balun). The co-planar balun 9 of FIG. 2(a) consists of metal conductor strips 10, 11 and 12 which are placed upon a dielectric substrate. Normally, the electrical length of conductors 10, 11 and 12 will be about ¼ of the wavelength λ of the signals to be processed. (The Greek Letter λ, (lambda) indicates the wavelength of a sinusoidal signal). However, the balun 9 has no ground plane as do microstrip or stripline transmission lines. Instead, conductors 10 and 12 are grounded at the output end as shown in FIG. 2(a). The co-planar balun of FIG. 2(a) has no metal ground plane. FIG. 2(b) is a cross-sectional view of balun 9 taken along line Y—Y of FIG. 2(a). The dielectric substrate 2 upon which conducting strips 10, 11 and 12 are placed may be made from alumina in a typical example. Referring again to FIG. 2(a), the input to the co-planar balun 9 is balanced because currents of equal magnitude but opposite directions flow in conductors 7 and 8 which are the input for the balun 9. As there is only one output line 13, the output signal is, of necessity, unbalanced. Co-planar baluns have been previously described in U.S. Pat. No. 3,835,421 which was issued on 10 Sept., 1974 to DeBrecht et al. and in an article entitled "Co-Planar Balun Circuits For GaAs FET High-Power Push-Pull Amplifiers", IEEE-GMTT International Microwave Symposium, University of Colorado, June, 1973, Digest pages 309-311 by R. E. DeBrecht.

A third component part of the broad band frequency divider is the microwave varactor diode. The varactors used in the practical realizations of this invention were gallium arsenide parametric amplifier varactors manufactured by Microwave Associates Inc. of Burlington, Massachusetts and Alpha Industries, Inc. of Woburn, Mass. The MA-48501 series of Microwave Associates and D-5147 series made by Alpha Industries were employed in two different realizations.

Figure 3A:
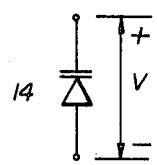
FIG. 3(a) is a symbolic representation of a varactor diode.
Figure 3B:
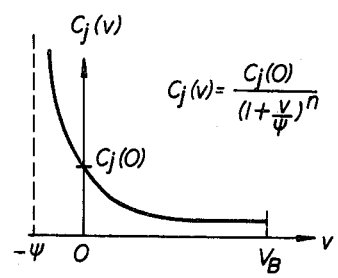
FIG. 3(b) is a graph which shows the variation of the capacitance across the terminals of the varactor as a function of the voltage applied across the terminals.

For the purpose of understanding this invention, the varactor may be conveniently thought of as a device whose capacitance varies in a non-linear fashion with the voltage applied across its terminals. In FIG. 3(a), a varactor 14 with voltage v across it is illustrated. FIG. 3(b) shows the manner in which the capacitance varies with reverse voltage across the varactor terminals. If the measured capacitance is $C_j(0)$ at zero bias, then an expression for the variation of the capacitance with voltage v is:

$$C_j(v) = C_j(0) \cdot (1 + v/\psi)^{-n}$$

For gallium arsenide n is about 0.45 and $\psi$ is about 1.2 volts.

The above equation is not a small signal approximation of the behaviour of a varactor. Instead, it describes the large signal behaviour of junction varactors generally. If voltage v approaches $-\psi$, the junction capacitance becomes very large and the varactor begins to conduct as would any forward biased diode. Furthermore, voltage "v" must not exceed the breakdown voltage $V_B$ of the varactor or else the varactor will cease to operate as desired. If necessary, a reverse DC bias voltage may be placed across varactor 14 of FIG. 3(a) to ensure that it will not conduct current.

Having described the three component parts which were used in the construction of the broad band frequency divider which is the subject matter of this invention, an embodiment of the invention will now be considered. The preceding background information was given to assist the reader in understanding the operation of the invention.

With the exception of the optional DC bias network for the varactors, FIG. 4 illustrates a broad band frequency divider. If the DC bias network is omitted, a DC return for the varactor diodes must be provided externally; otherwise the varactors will accumulate charge and bias themselves out of the correct region of operation.

Figure 4A:
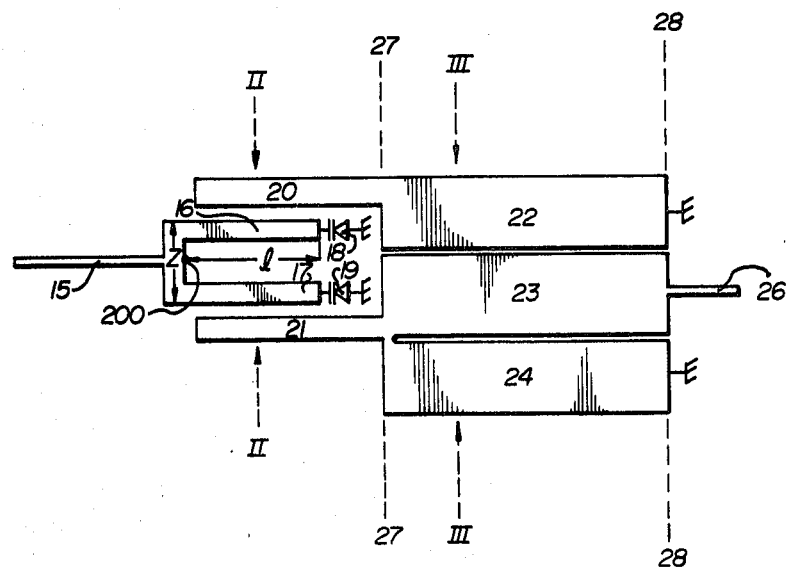
FIG. 4(a) is a schematic plan view of an embodiment of a broad band microwave frequency divider constructed in accordance with the invention, and incorporating elements depicted in FIGS. 1-3.

In FIG. 4(a), which is a plan view of the frequency divider, microstrip or stripline transmission line 15 carries an input electrical signal to microstrip or stripline transmission lines 16 and 17. Lines 16 and 17 are terminated with varactors 18 and 19. Line 16 extends from point 200 to varactor 18 and line 17 extends from point 200 to varactor 19. Line 15 ends at point 200. One terminal of each varactor is connected to an end of one of the transmission lines 16 and 17 and the other terminal is grounded by connection to the metallic ground plane of the microstrip or stripline transmission lines. The circuit comprising lines 16 and 17 and varactors 18 and 19 form a basic resonant circuit which supports oscillation at one-half of the frequency appearing on input line 15, if the input signal on line 15 is approximately sinusoidal and if the length of lines 16 and 17 is chosen in the manner described below. It is important to note that the critical dimension of lines 16 and 17 is "l" as shown on FIG. 4(a). The circuit referred to is of a broad band nature. For example, if the input signal contains frequency components ranging from 5-10 GHz and a desired output frequency range of 2.5-5 GHz were desired, then the circuit parameters would be chosen using the upper output frequency of 5 GHz as the approximate basic resonant frequency. (This is a small-signal resonance frequency). It is, of course, well known that any signal whether or not periodic may be represented by either the Fourier series or a Fourier transform. Thus, it is sufficient to examine the behaviour of the device for a given sinusoidal frequency. In summary, lines 16 and 17 and varactors 18 and 19 act in combination to form a subharmonic frequency generator with a balanced output signal.

The purpose of the balun consisting of lines 22, 23 and 24 and coupling microstrip or stripline transmission lines 20 and 21 is to extract and output signal from the basic resonant circuit. Generally, if lines 15, 16 and 17 are microstrip lines then lines 20 and 21 will be also. Similarly, if lines 15, 16 and 17 are striplines then lines 20 and 21 may be striplines too. Hereafter, reference will be made only to microstrip lines. However, the comments apply equally to striplines and other types of lines. Open circuited microstrip transmission lines 20 and 21 are located adjacent to lines 16 and 17 of the basic resonant circuit and so a signal is induced by electromagnetic coupling into lines 20 and 21 from lines 16 and 17. The balanced signal appearing on lines 20 and 21 is conveyed to the balun consisting of lines 22, 23 and 24 and then to line 26 where it appears as an unbalanced output signal.

Obviously, the person skilled in the art will recognize from the foregoing discussion that the significant result is the conversion of the balanced signal of a given input frequency to an unbalanced signal of an output frequency equal to half the input frequency, and that for such purpose ordinary care should be taken in the location and dimensioning of the circuit components mentioned, so that unwanted resonance and interference effects, etc. do not arise.

Figure 4B:
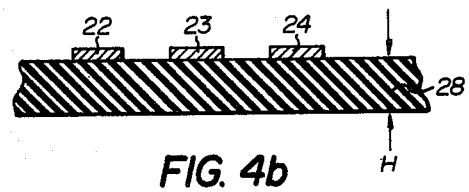
FIG. 4(b) is a schematic cross-sectional view of the co-planar balun of FIG. 4(a) taken along line III—III.
Figure 4C:
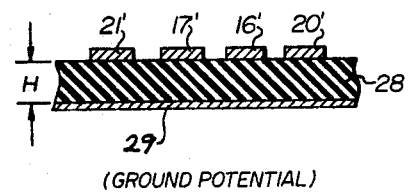
FIG. 4(c) is a schematic cross-sectional view taken along line II—II of FIG. 4(a), showing a microstrip construction variant of the frequency divider.
Figure 4D:
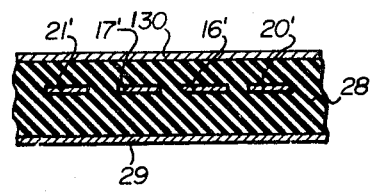
FIG. 4(d) is a schematic cross-sectional view taken along line II—II of FIG. 4(a), showing a stripline construction variant of the frequency divider.

As mentioned above, there is no ground plane in the balun section of FIG. 4(a) which lies between demarcation lines 27 and 28. FIG. 4(b) shows a cross-sectional view of the balun consisting of lines 22, 23 and 24 along lines III—III. The microstrip lines 20, 16, 17 and 21 are shown in a cross-sectional view along line II—II in FIG. 4(c). Dielectric substrate 28 lies between metal conducting strips 21', 17', 16', and 20' and ground plane 29. In FIG. 4(d) a stripline version of FIG. 4(c) is shown with metal conducting strips 21', 17', 16' and 20' and ground planes 29 and 130.

The operation and design of the circuit in FIG. 4(a) is now examined. Firstly, the generation of subharmonic frequencies is a result of the specific non-linear nature of the varactors 18 and 19 in the basic resonant circuit. The inventor herein has published a general theoretical analysis of the behaviour of varactors in balanced subharmonically resonant circuits in his Doctoral Thesis at the University of London, Imperial College of Science and Technology in July, 1964. The analysis of the ideal case using lumped circuit elements shows that if the input sinusoidal signal frequency to a lumped element model of the basic resonant circuit comprising lines 16 and 17 and varactors 18 and 19 is $f_{in}$ changed to agree with FIGS. 10 and 11 and to avoid confusion with the resonance frequency $f_o$ referred to on page 18, then the output will contain component signals at frequencies $f_{in}/2$, $3f_{in}/2$, $5f_{in}/2$, $7f_{in}/2$, etc. Obviously, the high frequency signals at frequencies $3f_{in}/2$, $5f_{in}/2$ etc. may be readily removed by filtering. More importantly if the balance is perfect there are no even order harmonics (i.e. $f_{in}[=2\times f_{in}/2]$, $2f_{in}[=4\times f_{in}/2]$, $3f_{in}[=6\times f_{in}/2]$, ...). Removal of the $f_{in}$ output frequency component is vital because in an octave-bandwidth divide-by-two device, the undesired second-harmonic of the desired output frequency at the lower edge of the band $f_{in}[=2\times f_{in}/2]$ will be the same frequency as the desired output frequency $f_{in}/2$ at the upper edge of the band. In such a case the undesired second harmonic $f_{in}[=2\times f_{in}/2]$ could not be removed by conventional filtering techniques. It should be mentioned that the inventor's analysis was theoretical and dealt with lumped circuit elements operating at much lower frequencies than are encountered here. However, the inventor's analytical technique is entirely applicable to this case.

Figure 5A:
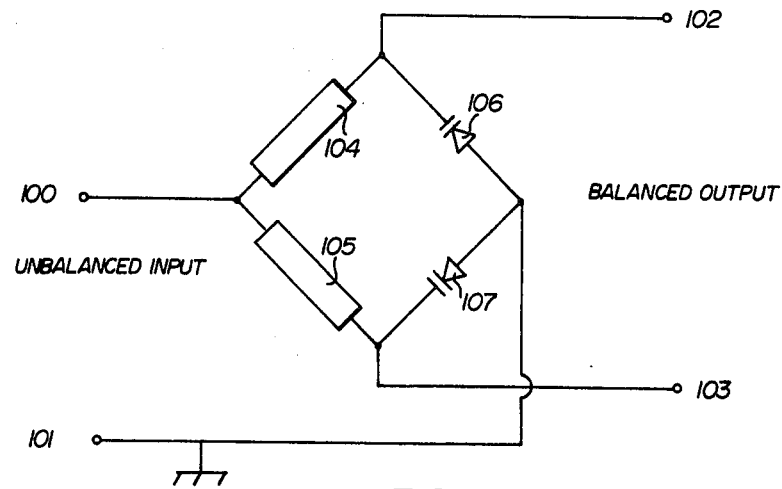
FIG. 5(a) is a schematic circuit diagram of the basic resonant circuit drawn as a bridge network.

Secondly, further insight into the nature of the basic resonant circuit comprising transmission lines 16 and 17, and varactors 18 and 19 may be had by considering FIG. 5(a). FIG. 5(a) is a schematic circuit diagram of the basic resonant circuit drawn as a bridge network. An input signal is placed across ports 100 and 101, port 101 being grounded and corresponding to the metallic ground plane 29 of FIG. 4(c). Port 100 corresponds to the upper metallic strip of microstrip transmission line 15 of FIG. 4(a). Conducting strips 104 and 105 correspond to conducting strip 17 and 16 of FIG. 4(a). The microwave varactors 106 and 107 correspond to microwave varactors 18 and 19 of FIG. 4(a).

Figure 5B:
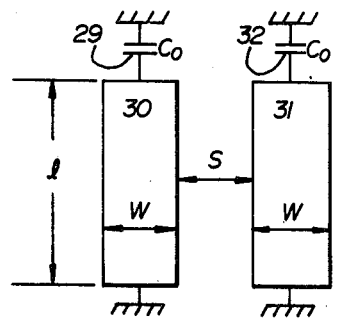
FIG. 5(b) is a schematic plan view of the basic resonant circuit with the varactors replaced by their average capacitance $C_o$.

The design of basic resonant circuits may be further understood by referring to FIGS. 4(a), 5(b), 6 and 7. For design purposes, the basic small-signal resonance frequency is chosen to be at or above the upper output frequency of the band in which the device is to operate. At resonance, a standing wave will appear across transmission line 16 and varactor 18 and transmission line 17 and varactor 19. At the resonance frequency the voltage at the input side of lines 16 and 17 will be 0. (i.e. a short circuit condition). If the varactors have an average capacitance of $C_0$ and if in FIG. 4(a) dimension Z is small compared with dimension l then the basic resonant circuit may be depicted as shown in FIG. 5(b). In addition, the effects of lines 20 and 21 and the balun consisting of lines 22, 23 and 24 of FIG. 4(a) on the signal on lines 16 and 17 are neglected for analytical purposes. The capacitors 29 and 32, of FIG. 5(b) represent the average capacitance $C_0$ of the varactors 18 and 19 of FIG. 4(a). Microstrip lines 30 and 31 correspond to lines 16 and 17 of FIG. 4(a). The lines are of electrical length $\theta$, geometrical width W and geometrical length l. They may or may not be electromagnetically coupled to each other. The spacing between lines 30 and 31 is S. The substrate has a thickness designated by H as shown in FIGS. 4(b) and 4(c).

An analysis of coupled microstrip transmission lines such as those shown in FIG. 1(d), lines 16 and 17 of FIG. 4(a), and lines 30 and 31 of FIG. 5(b) has been performed by T. G. Bryant and J. A. Weiss in "Parameters of Microstrip Transmission Lines and of Coupled Pairs of Microstrip Lines", IEEE Transactions on Microwave Theory and Techniques, Volume MTT-16, No. 12, pages 1021-1027, December, 1968. In addition, Bryant and Weiss have published curves in an article entitled "Even and Odd Mode Characteristic Impedance for Coupled Microstrips", which appeared in Volume 1 of the Microwave Engineer's Handbook, which was printed in 1971 by Artech House of Dedham, Mass. Bryant and Weiss characterized the sinusoidal signal behaviour of coupled microstrip transmission lines by two impedances $Z_{oo}$ and $Z_{oe}$. $Z_{oe}$ is referred to as the even mode impedance and $Z_{oo}$ is the odd mode impedance. The latter reference (Microwave Engineer's Handbook) has diagrams which relate to ratios of W/H and S/H to $Z_{oe}$ and $Z_{oo}$ for various values of substrate relative dielectric constant $e_r$. Thus, there are numerical data which permit $Z_{oe}$ and $Z_{oo}$ to be found if S/H and W/H are known. H is the thickness of the substrate 28 of FIG. 4(c).

Figure 6:
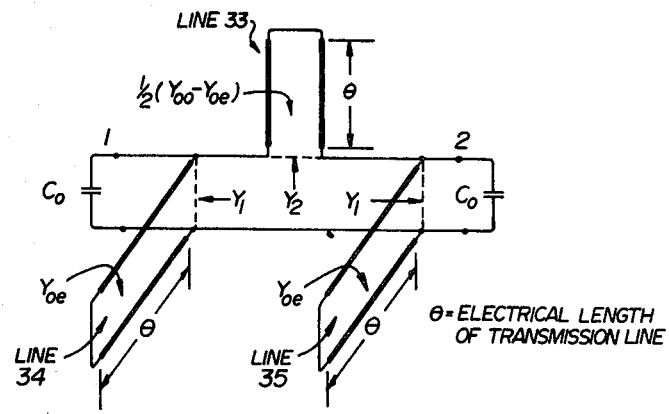
FIG. 6 is a schematic circuit diagram of the equivalent open-wire circuit of the basic resonant circuit of FIG. 5.

Using the method of Sato and Cristal published in "Simplified Analysis of Coupled Transmission Line Networks", IEEE Transactions on Microwave Theory and Techniques, Volume MTT-18, No. 3, March, 1970, pages 122-131, an open-wire equivalent circuit for FIG. 5(b) can be shown to be that of FIG. 6. Transmission line 33 of the equivalent circuit has electrical length $\theta$ and a characteristic admittance of $(Y_{oo}-Y_{oe})/2$. The characteristic admittance of short-circuited lines 34 and 35 is $Y_{oe}$. $Y_2$ is the admittance seen when looking into short-circuited transmission line 33. $Y_1$ is the combined admittance of a varactor average capacitance $C_o$ and one of the short circuited lines 34 or 35 seen looking in the direction of the arrows for $Y_1$ of FIG. 6.

Thus, $$Y_1 = j\omega C_o - jY_{oe} \cot \theta$$

$$Y_2 = j(\tfrac{1}{2})(Y_{oo}-Y_{oe}) \cot \theta$$

At resonance, the sum of the impedances $1/Y_1$, $1/Y_2$ and $1/Y_1$ is 0, or $$Y_1 + 2Y_2 = 0.$$

This gives:

$$\omega C_o = Y_{oo} \cot \theta$$

but $\theta$ is equal to $\omega l/v$,
where l = geometrical length,
$\omega$ = angular frequency $2\pi f$, and
v = phase velocity.
Thus, for an angular resonant frequency $\omega_o = 2\pi f_o$, the design equation for the physical length l of the transmission lines 30 and 31 of FIG. 5 is $$l = \frac{v}{\omega_o} \arctan\left[\frac{1}{\omega_o C_o Z_{oo}}\right].$$

Since $\omega_o$, v, $C_o$ and $Z_{oo}$ are known, l may be easily computed. $Z_{oo}$ is found by examining the Bryant and Weiss curves which plot $Z_{oo}$ as a function of S/H and W/H, for various values of relative substrate permittivity $\epsilon_r$. $C_o$ is approximately $C_j(V_o) + C_p$ where $V_o$ is the applied reverse bias voltage and $C_p$ is the fixed package capacitance of the varactor.

Figure 7:
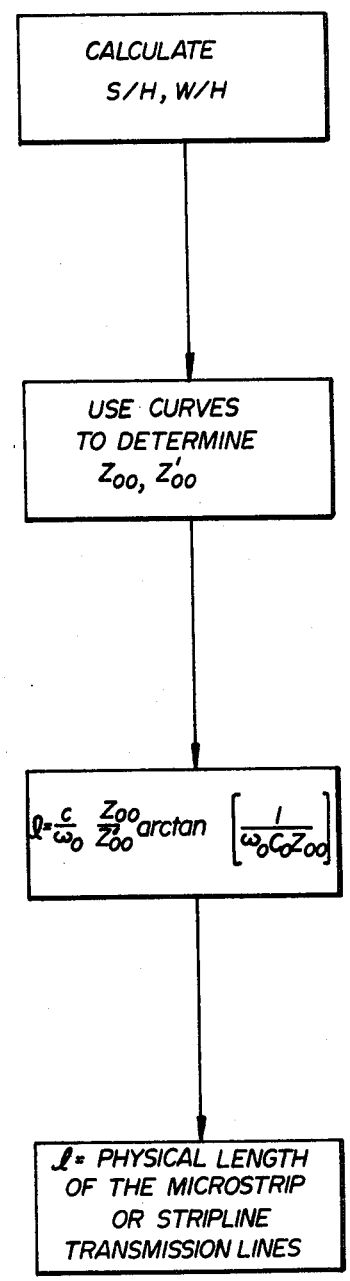
FIG. 7 is a block diagram showing the steps for the calculation of the length of the transmission lines of the basic resonant circuit of the microwave frequency divider of FIG. 8.

FIG. 7 is a block diagram summarizing the steps for calculating l, the geometric length of the transmission lines 30 and 31 of FIG. 5. v is computed as a fraction of the speed of light in free space c. That fraction is $Z_{oo}/Z'_{oo}$. $Z'_{oo}$ is the odd mode free space impedance of transmission lines 30 and 31 of FIG. 5. This would occur, for example, where the substrate is made of air and not alumina.

The final equation for l is $$l = \frac{c}{\omega_o} \frac{Z_{oo}}{Z'_{oo}} \arctan[1/(\omega_o C_o Z_{oo})].$$

In general, l will correspond to an electrical length less than $\lambda/4$ at the resonance frequency $\omega_o$.

Having discussed the design and operation of the broad band frequency divider, a practical realization of this device including the DC bias arrangement is next considered.

Figure 8:
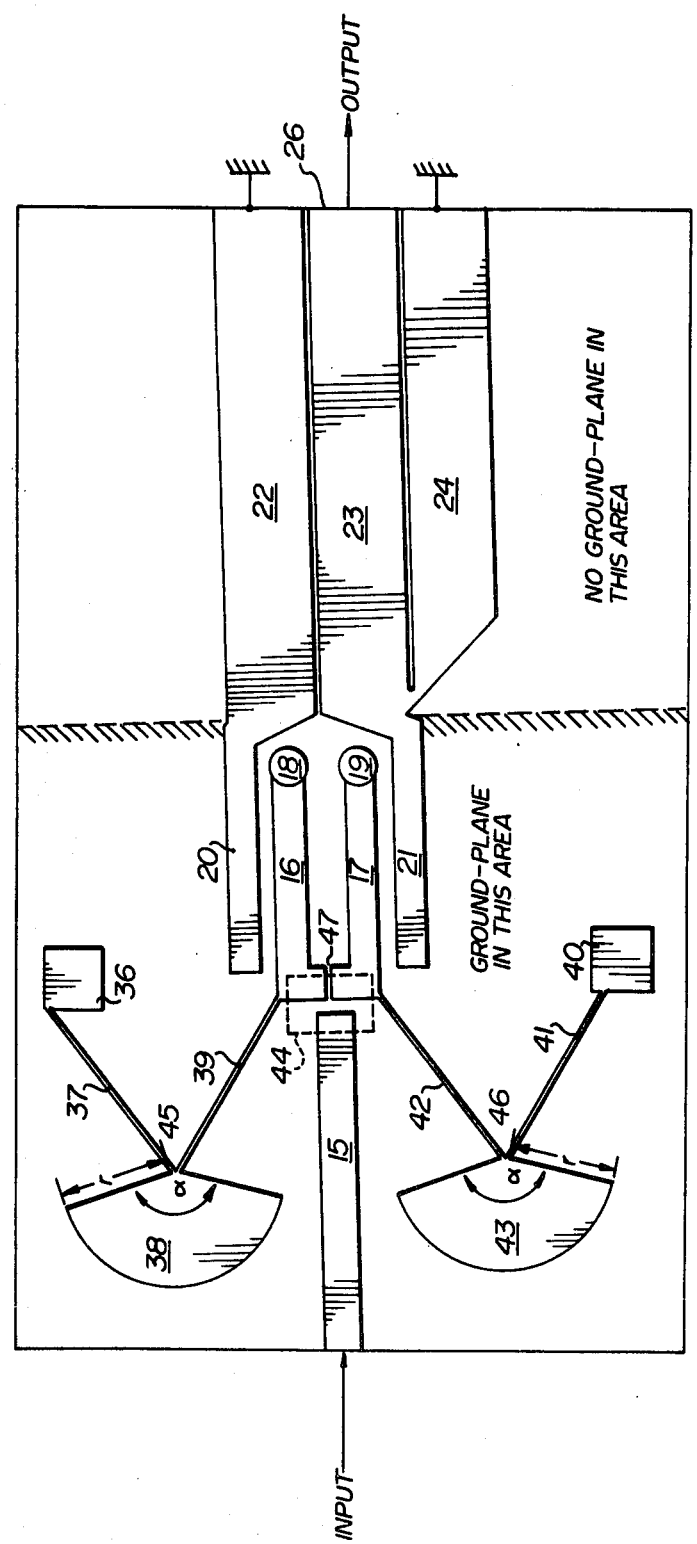
FIG. 8 is a plan view of an embodiment of a frequency divider constructed according to the invention, illustrating in particular the technique for the application of DC bias.

FIG. 8 is a plan view of the layout of a varactor frequency divider which was designed to accommodate an input frequency range of 8.5 to 9.5GHz. The similarity to FIG. 4(a) is apparent and like numerals denote like components. DC blocking chip capacitor 44 is placed between the microstrip line 15 and lines 16 and 17. At microwave frequencies capacitor 44 is a short circuit. As a variation of the basic design described here, microstrip line 15 may be used as an input matching transformer in which case its impedance will be different from 50 ohms and its length will be $\lambda/4$ at or near the centre of the input band of frequencies. Further, capacitor 44 may be chosen to partially annul the inductive part of the input impedance. The input impedance of the basic resonant circuit looks inductive because the input frequency is in general higher than the resonance frequency. Numerals 18 and 19 denote the matched pair of varactors. DC bias is applied to varactors 18 and 19 by way of pads 36 and 40 which consist of layers of conducting material placed upon the surface of the substrate layer. An individual source of DC voltage may be applied to each pad or a common source may be applied to both pads 36 and 40. In either case, one terminal of a DC source is connected to (say) pad 36 and the other terminal of the DC source is connected to the ground conductive layer. Radial transmission lines 38 and 43 at operational microwave frequencies have zero or very small input impedances at points 45 and 46. Such radial or "half-moon" lines are discussed and partially analyzed by B. A. Syrett in a Master of Engineering Thesis at Carleton University in Ottawa, Canada, January, 1973, entitled "The Use of the Automatic Network Analyzer in the Development and Modelling of a Novel Broad Band Bias Line for X-Band Microstrip Circuits". The optimum value of angle $\alpha$ is 150°. This value was not found by Syrett. The radius "r" of the "half moon" lines is approximately a quarter of a wavelength at the centre frequency of the input band of frequencies. Transmission lines 37, 39, 41 and 42 have a physical length which is also $\frac{1}{4}$ of a wavelength at the centre frequency of the input band of frequencies. So, at point 47, the impedance looking back at radial lines 38 and 43 is substantially that of an open circuit or infinity. The impedance of the bias circuit at the output frequencies is irrelevant because at resonance, point 47 is a virtual ground. Two biasing circuits are provided to (1) preserve the overall symmetry of the device and (2) permit independent biasing of the two varactors to optimize the balance if necessary. In case (2), two separate blocking capacitors 44 would be used, one from 15 to 16, the other from 15 to 17. The electrical length of the co-planar balun is chosen to be $\lambda/4$ at the centre of the output band of frequencies. The wavelength in the balun can be estimated from the effective dielectric constant data given by DeBrecht in the reference quoted above and is about $(c/f) \sqrt{2/(1+\epsilon_r)}$. As shown in FIG. 8, the entire microstrip and co-planar balun circuit is intentionally skewed with respect to its substrate. This permits the input and output connectors to transmission line 15 and output point 26, being one end of arm 23 of the balun, to be mounted on the centre line of a metal enclosure box which holds the entire device. The box is milled out of solid brass and is nickel plated. There is a rectangular cavity underneath the co-planar balun part of the substrate, which operates without a ground plane. A monolithic box construction minimizes undesirable resonances at metal to metal interfaces. Its maximum transverse dimension is limited to a value corresponding to a cut-off wave guide at the maximum input frequency of interest. This helps to minimize feedthrough of the input frequency to the output side of the broad band frequency divider, namely point 26.

Note that the resonant frequency $f_o$ of the device increases as the reverse DC bias is increased. The reason for this is that the average capacitance $C_o$ reduces in accordance with FIG. 3(b) as the reverse voltage is increased. By rearranging the equation on page 19 one gets $$f_o = \frac{c}{2\pi l} \frac{Z_{oo}}{Z'_{oo}} \arctan\left[\frac{1}{\omega_o C_o Z_{oo}}\right]$$

and so $f_o$ increases as $C_o$ decreases.

Figure 9A:
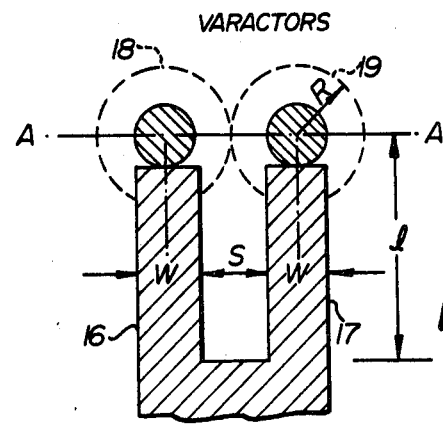
FIG. 9(a) is a plan view of the varactors and the microstrip transmission lines of FIG. 8.
Figure 9B:
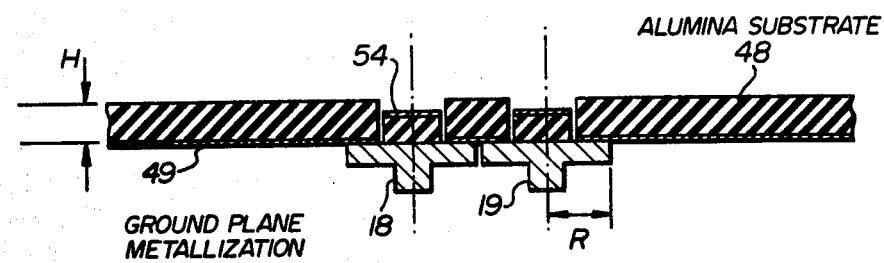
FIG. 9(b) is a cross-sectional view taken along line A—A of FIG. 9(a).
Figure 9C:
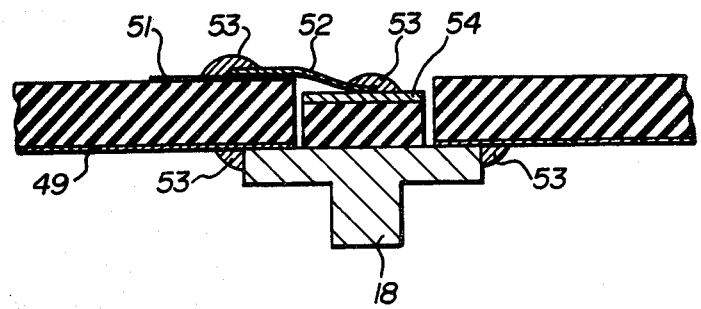
FIG. 9(c) is an enlarged cross-sectional view of one varactor diode of FIG. 8 showing the manner in which it is connected to the microstrip transmission line and the ground plane.

FIG. 9 shows the manner in which the varactors are attached to the alumina substrate layer. FIG. 9(a) is a plan view of the varactors 18, 19 and microstrip lines 16 and 17. In FIG. 9(b), a cross-sectional view of the varactors 18 and 19 is illustrated taken along line A—A of FIG. 9(a). Circular holes are cut through the dielectric substrate 48 of thickness H and the ground plane metallization 49. The varactor flange has radius R. As seen in the enlarged cross-sectional view of one varactor in FIG. 9(c), the varactor package, here 18, is electrically connected to the metallized ground plane 49 by beads 53 of silver paint, solder or conductive epoxy. Connection may also be established by means of pressure. Conductive tabs 52 are similarly affixed to the metallization strip 51 and upper side of the varactor 54 by beads 53. They may also be attached by welding.

Figure 10:
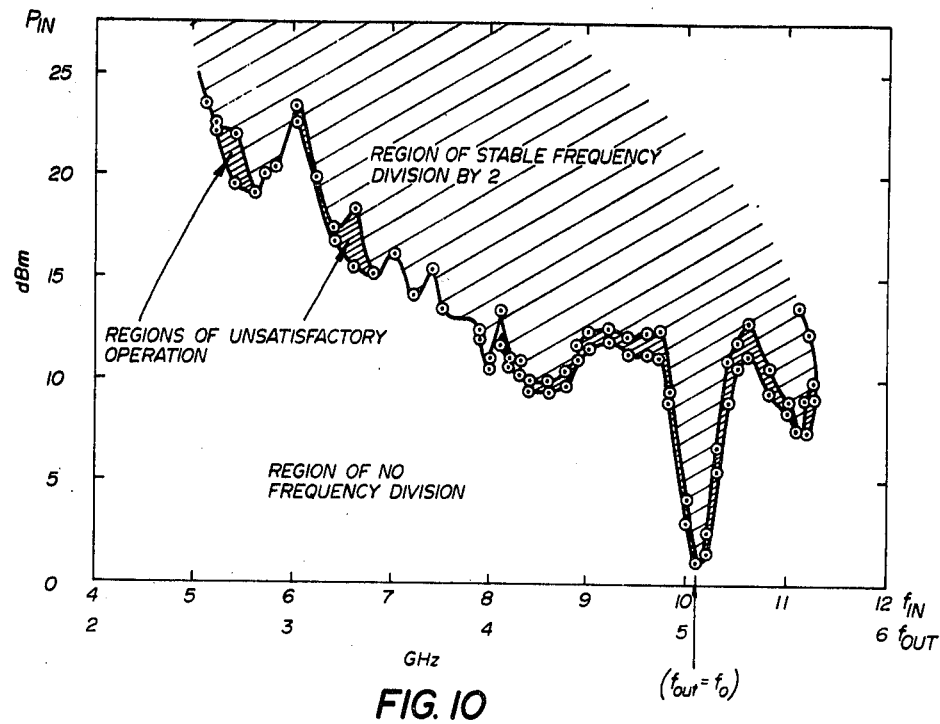
FIG. 10 illustrates the region of divide-by-two operation of the frequency divider of FIG. 8 together with the regions of unsatisfactory performance of the broad band frequency divider by plotting the input power, $P_{in}$, required for operation as a function of output and input frequency, $f_{out}$ and $f_{in}$ respectively.

At this point, having described the operation of the broad band frequency divider and its manufacture, some sample results will be described. Zero DC bias was applied to the pads 36 and 40 of FIG. 8. FIG. 10 shows the value of input power $P_{in}$ in dBm (dBm=decibels relative to 1.0 milliwatt) which is needed to attain frequency division by two; $P_{in}$ is shown as a function of both input frequency $f_{in}$ and output frequency $f_{out}$. For each frequency a minimum value of input power $P_{in}$ or greater is necessary for stable frequency division. The region of stable frequency division is indicated by halftone dots; the regions of unsatisfactory operation wherein hysteresis effects may occur and/or spurious output frequencies may be generated are indicated by diagonal-line shading. For broad band operation, $P_{in}$ should exceed about 14 dBm. By keeping $P_{in}$ above this minimum, the regions of unstable operation are avoided and broad band frequency division is attained.

Figure 11:
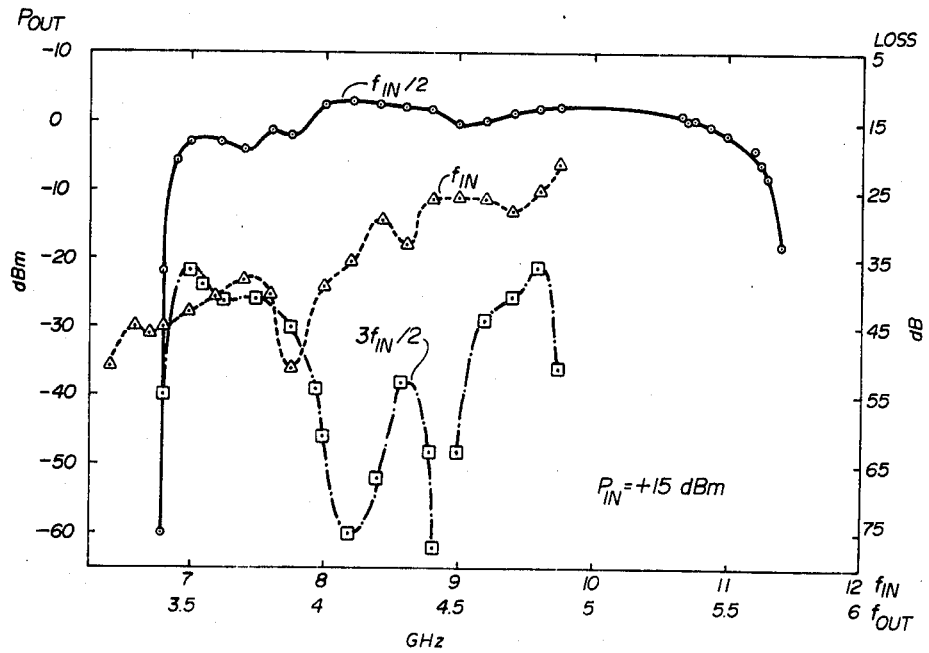
FIG. 11 illustrates the variation of the output power $P_{out}$ at the output frequency $f_{out}(f_{in}/2)$ of the broad band frequency divider of FIG. 8 as a function of the input frequency $f_{in}$, for a fixed input power level $P_{in}$. The variation of the output powers at the second harmonic ($f_{in}$) and the third harmonic ($3 f_{in}/2$) of the desired signal at $f_{in}/2$ are also shown.

In FIG. 11, the output power $P_{out}$ in dBm is plotted against input frequency $f_{in}$ and output frequency $f_{out}$, when the input power $P_{in}$ is 15 dBm. Over the input frequency range $f_{in}$ of 6.9 to 11.1 GHz, the output is flat to within plus or minus 3.5 dB. Over a reduced range of 7.9 to 10.9 GHz, it is flat to plus or minus 1.5 dB. FIG. 11 also shows the level of the second and third harmonics ($f_{in}$ and $3f_{in}/2$) of the divided-by-two output signal ($f_{in}/2$). Both of these signals are at least 10 dB below the main signal for input frequencies in the range of 6.9 to 9.7 GHz. The frequency response of the divided-by-two output signal $f_{in}/2$ corresponds to a 3-dB fractional bandwidth of 31.9% or a 7-dB fractional bandwidth of 46.7% (fractional bandwidth is defined as $$2(f_{max}-f_{min})/f_{max}+f_{min} \times 100\%$$

where $f_{max}$ and $f_{min}$ are the frequencies at the band-edges.) These results are much better than the original design goal of 12% and indicate that even wider bandwidths are attainable using optimized designs. In general the fractional bandwidth obtained varies with the magnitude of the input power $P_{in}$. It is anticipated that with further improvements in construction, even better results than those presented in FIG. 11 may be obtained.

Figure 12:
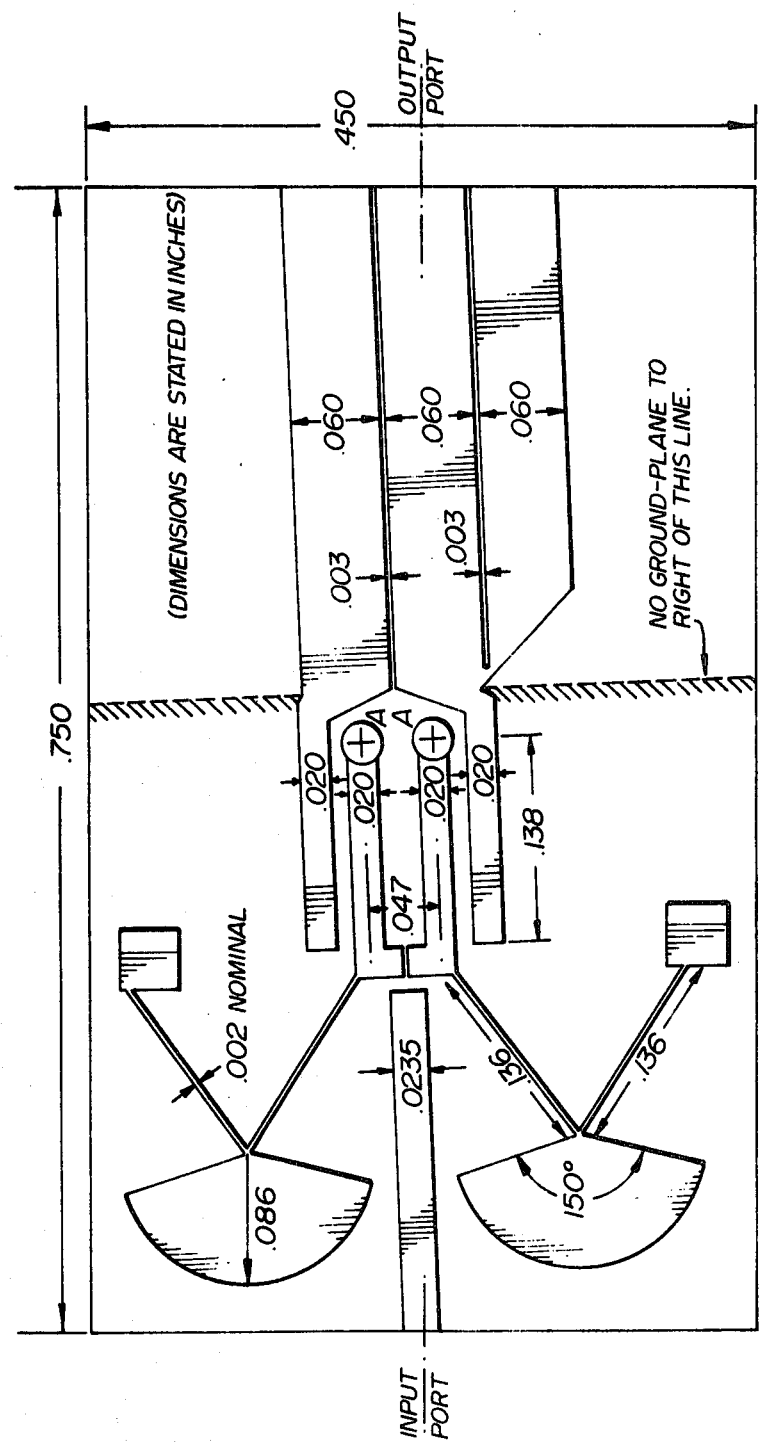
FIG. 12 is a plan view of the broad band frequency divider of FIG. 8, showing the dimensions of the components (in inches) of an actually-constructed specimen of such frequency divider.

FIG. 12 illustrates the dimensions of a sample broad band microwave frequency divider made according to the invention herein. The conducting metallization on the upper surface is composed of the following layers evaporated on to the alumina substrate:

Layer 1:

2000 Angstrom units ($7.87 \times 10^{-6}$ inch) of chromium

Layer 2:

4.5 microns ($1.77 \times 10^{-4}$ inch) of copper

Layer 3:

2000 Angstrom units ($7.87 \times 10^{-6}$ inch) of nickel

Layer 4:

2000 Angstrom units ($7.87 \times 10^{-6}$ inch) of gold.
The conducting metallization on the lower (ground plane) surface of the alumina substrate is the same except that the final gold layer is omitted. This provides good solderability to the supporting structure and also saves gold. The thickness of the alumina substrate is 0.025 inch. Letters A designate holes of diameter 0.035 inch drilled with a diamond drill in the substrate to accommodate that part of the varactor package which protrudes through the ground plane into the dielectric substrate, as shown in FIGS. 9(b) and 9(c). The chip capacitor 44 of FIG. 8 has a capacitance of 1.2 picofarads. It is made by American Technical Ceramics of Huntington Station, New York, the Type is ATC-100 A and it is a cube 0.050 inch on a side. Lastly, standard connectors are attached at the input and output ports.

While particular embodiments of this invention have been described and shown, it will be understood that many modifications may be made without departing from the spirit thereof, and it is contemplated by the appended claims to cover any such modifications as fall within the true spirit and scope of this invention.

For example, it is expected that the general concept of the invention could be embodied in yet other forms of signal transmitting and processing apparatus. FIGS. 13(a) and 13(b) represent a possible alternative such structure, not yet built or tested.

In FIG. 13, the frequency divider is realized using co-planar waveguide. The major difference between co-planar waveguide and microstrip or stripline transmission lines is that the ground plane and all other conducting layers are on the same side of the dielectric substrate layer. Co-planar waveguides were described by Wen in "Coplanar Waveguide: A Surface Strip Transmission Line Suitable for Non Reciprocal Gyro Magnetic Device Applications", IEEE Transactions on Microwave Theory and Techniques, Volume MTT-17, No. 12, December 1969, pp. 1087-1090.

FIG. 13(a) is a schematic plan view of a broad band microwave frequency divider constructed using co-planar waveguide. Metal conducting layers (viz.—131, 132, 133, 138, 139, 140, 141, 142 and 143) are deposited on a dielectric substrate 144, best seen in the cross-sectional view of FIG. 13(b) taken along line A—A of FIG. 13(a). Layer 138 is connected to ground potential. Input layer 131 feeds lines 132 and 133 by way of layers 145 and 146. Layers 132 and 133 are terminated by varactor diodes 134 and 135 which are connected between layer 138 and layer 133 and between layer 138 and layer 132. Refer to FIG. 3(a) for an enlarged view of the pictorial representation of a varactor diode, as used herein.

The basic resonant circuit consists of layers 132 and 133, diodes 134 and 135 and ground layer 138. As previously mentioned, input signals are carried to the basic resonant circuit by input layer 131 from the input port.

Layers 142 and 143 couple the signal appearing on layers 132 and 133 to a co-planar balun represented by arms 139, 140 and 141. As before, the balun converts a balanced signal into an unbalanced signal which appears at the output port, such output signal appearing at one end of layer 140. (as shown in FIG. 13(a)).

The details of DC biasing are not shown in FIG. 13(a). However, for example, DC bias might be applied by introducing a DC voltage across input layer 131 and ground layer 138.

FIG. 13(b) depicts a schematic cross-sectional view along line A—A of FIG. 13(a). The dielectric substrate layer 144 does not have a ground layer as previously discussed. Refer to FIGS. 1(a), 1(b) and 1(d). Conducting layers 138, 133, 143, 142, 132 are shown in cross-section.

It is expected that a device built using co-planar waveguide could operate at extremely high frequencies. (e.g. 20-100 GHz). For example, elimination of the substrate layer would allow a larger size device to be constructed than one with a dielectric substrate layer.

Lastly, it has not yet been ascertained whether or not the formula for "l" found at page 18 is applicable to the co-planar waveguide realization of a broad band frequency divider.

The embodiments of the invention in which an exclusive property or privilege is claimed are defined as follows:

1. A microwave broad band frequency divider comprising:
 (a) an even number of matched microwave varactor diodes, each of said diodes having a unique first terminal and a unique second terminal;
 (b) a plurality of terminated microstrip transmission lines equal in number to the number of diodes, each of said plurality of terminated microstrip transmission lines comprising a first conductor and a second conductor, one end of the first conductor and one end of the second conductor defining a first end of the said last mentioned transmission line, and the other end of the first conductor and the other end of the second conductor defining a second end of the last mentioned microstrip transmission line, a unique one of each of said diodes terminating said second end of a corresponding unique one of said transmission lines by connecting said first conductor at said second end to said first terminal of said diode and connecting said second conductor at said second end to said second terminal of said diode;

(c) an input microstrip transmission line coupled to said first end of all of said plurality of terminated transmission lines for conveying an input signal to said plurality of transmission lines;

(d) a balun electromagnetically coupled to said plurality of microstrip transmission lines, said balun transforming a balanced signal from said plurality of microstrip transmission lines into an unbalanced output signal;

(e) microstrip means positioned in the vicinity of said plurality of transmission lines and electromagnetically coupled therewith and electrically connected to said balun for conveying a signal from said plurality of lines to said balun.

2. A frequency divider as defined in claim 1, wherein the input microstrip transmission line is electrically connected to the first end of all of said plurality of terminated transmission lines.

3. A frequency divider as defined in claim 1, wherein the input microstrip transmission line is electromagnetically coupled to and at the same time separated by a dielectric medium from the first end of all of said plurality of terminated transmission lines.

4. A frequency divider as defined in claim 3, wherein the said even number is two.

5. A frequency divider as recited in claim 4 further comprising means for applying a DC bias to each of said microwave varactor diodes.

6. A frequency divider as recited in claim 4 wherein said plurality of transmission lines are of the same length measured from said first end to said second end, said first ends of said plurality of transmission lines lying on the same straight line, said plurality of transmission lines being parallel to one another and perpendicular to said straight line and wherein the spacing between said parallel transmission lines is small compared with said length.

7. A frequency divider as recited in claim 4 wherein said plurality of transmission lines are of the same length measured from said first end to said second end, said first ends of said plurality of transmission lines lying on the same straight line, said plurality of transmission lines being parallel to one another and perpendicular to said straight line and wherein the spacing between said parallel transmission lines is short.

8. A microwave broad band frequency divider, comprising:
(a) an even number of matched pairs of microwave varactor diodes, each of said diodes having a unique first terminal and a unique second terminal;
(b) a plurality of terminated stripline transmission lines equal in number to the number of said diodes, each of said plurality of lines having a pair of ground conductors and an inner strip conductor, and having a first end and a second end, one end of said inner strip conductor and one end of said pair of ground conductors defining said first end of the last mentioned transmission line and the other end of said inner strip conductor and the other end of said pair of ground conductors defining a second end of said last mentioned stripline transmission line, a unique one of each of said diodes terminating said second end of a unique one of said terminated stripline transmission lines by connecting said inner conductor strip at said second end to said first terminal of said diode and connecting one of said ground conductors at said second end to said second terminal of said diode;

(c) an input stripline transmission line coupled to said first end of said plurality of terminated transmission lines for conveying an input signal to said plurality of lines;

(d) a balun electromagnetically coupled to said plurality of terminated transmission lines, said balun transforming a balanced signal from said plurality of terminated transmission lines into an unbalanced output signal;

(e) stripline means positioned in the vicinity of said plurality of terminated transmission lines and electromagnetically coupled therewith having an inner conductor electrically connected to said balun for conveying a signal to said balun from said plurality of lines.

9. A frequency divider as defined in claim 8, wherein the input stripline transmission line is electrically connected to the first end of all of said plurality of terminated transmission lines.

10. A frequency divider as defined in claim 8, wherein the input stripline transmission line is electromagnetically coupled to and at the same time separated by a dielectric medium from the first end of all of said plurality of terminated transmission lines.

11. A frequency divider as defined in claim 10, wherein the said even number is two.

12. A frequency divider as recited in claim 11 further comprising means for applying a DC bias to each of said microwave varactor diodes.

13. A frequency divider as recited in claim 11 wherein said plurality of transmission lines are of the same length measured from said first end to said second end, said first ends of said plurality of transmission lines lying on the same straight line, said plurality of transmission lines being parallel to one another and perpendicular to said straight line and wherein the spacing between said parallel transmission lines is small compared with said length.

14. A frequency divider as recited in claim 11 wherein said plurality of transmission lines are of the same length measured from said first end to said second end, said first ends of said plurality of transmission lines lying on the same straight line, said plurality of transmission lines being parallel to one another and perpendicular to said straight line and wherein the spacing between said parallel transmission lines is short.

15. A microwave broad band frequency divider comprising:
(a) a layer of dielectric material having an upper side and a lower side, said sides being parallel to one another;
(b) a first pair of substantially parallel, rectangularly shaped layers of conductive material being the upper conductors of a first pair of microstrip transmission lines, located on said upper side of said dielectric layer, each said layer having its length l, width, thickness and spacing from the other said layer selected according to the formula for resonance at angular frequency $\omega_o$ $$l = \frac{v}{\omega_o} \arctan\left[\frac{1}{\omega_o C_o Z_{oo}}\right],$$

where v is the phase velocity, $C_o$ is the average capacitance of the varactor diodes and $Z_{oo}$ is the odd mode impedance of said first pair of layers, each layer having a first end and a second end of its length l dimension, said layers being in parallel alignment along their length l dimension;

(c) an input layer of conductive material being the upper conductor of an input microstrip transmission line, located on said upper side of said dielectric layer, mounted in proximity to said first ends of both of said first pair of rectangularly shaped layers, said input transmission line being the means for conveying an input signal to said first pair of microstrip transmission lines;

(d) a co-planar balun for providing unbalanced signals from the frequency divider, having three adjacent parallel strips of conductive material placed on said upper side of said dielectric layer, the two outermost of said strips being electrically connected to ground potential, at the output end, said balun being located near said second end of said first pair of layers;

(e) a layer of conductive material at ground potential, being the ground plane of the microstrip transmission lines referred to herein, placed on said lower side of said dielectric layer covering substantially all of said lower side except those areas of said lower side lying beneath the area of and around the co-planar balun located on said upper side;

(f) a first varactor diode, having a unique first terminal and a unique second terminal, mounted in an aperture in said dielectric layer, said aperture being positioned at said second end of a unique one of said first pairs of layers, said first terminal being electrically connected to said second end of said first pair of layers and said second terminal being electrically connected to said ground layer;

(g) a second varactor diode matched to said first diode having a unique first terminal and a unique second terminal corresponding to said first terminal and said second terminal of said first diode, mounted in an aperture in said dielectric layer, said aperture being positioned at said second end of the other of said first pair of layers, said first terminal of said second diode being electrically connected to said second end of said other of said first pair of layers and said second terminal of said second diode being electrically connected to said ground layer; and (h) a second pair of parallel substantially rectangular layers of conductive material, being the upper conductors of a second pair of microstrip transmission lines, mounted on said upper side of said layer of dielectric material, being positioned near but substantially parallel to and aligned with said first pair of layers along the length l dimension, and having substantially the same length, width, and thickness as one of said first pair of layers, whereby to electromagnetically couple a balanced signal from said first pair of microstrip transmission lines and convey it to said co-planar balun, each layer of said second pair having a first end and a second end and being electrically connected to said balun at said second end of each of said layers.

16. A microwave broad band frequency divider as recited in claim 15 further comprising means for applying a DC bias to each of said varactor diodes.

17. A microwave broad band frequency divider as recited in claim 15 wherein said input layer is electrically connected to said first pair of layers.

18. A microwave broad band frequency divider as recited in claim 15 wherein said parallel conductive strips of said co-planar balun are of electrical length about one-quarter of the wavelength of the output signals of the frequency divider.

19. A microwave broad band frequency divider comprising:

(a) a layer of dielectric material having an upper side and a lower side, said sides being parallel to one another;

(b) a first pair of substantially parallel, rectangularly shaped layers of conductive material being the inner conducting strips of a first pair of stripline transmission lines, located on a plane within said layer of dielectric material parallel to said upper side and lower side, each said layer having its length l, width, thickness and spacing from the other said layer selected according to the formula for resonance at frequency $\omega_o$ $$l = \frac{v}{\omega_o} \arctan\left[\frac{1}{\omega_o C_o Z_{oo}}\right],$$

where v is the phase velocity, $C_o$ is the average capacitance of the varactor diodes and $Z_{oo}$ is the odd mode impedance of said first pair of layers, each layer having a first end and a second end of its length l dimension, said layers being in parallel alignment along their length l dimension;

(c) an input layer of conductive material being the inner conductor strip of an input stripline transmission line, located on said plane within said layer of dielectric material, mounted in proximity to said first end of both of said first pair of rectangularly shaped layers for electromagnetic coupling thereto, said input stripline transmission line being the means for conveying an input signal to said first pair of stripline transmission lines;

(d) a co-planar balun for providing unbalanced output signals from the frequency divider, having three adjacent parallel strips of conductive material placed on said inner plane of said layer of dielectric material, the outermost of said strips being electrically connected to ground potential, said balun being located near said second ends of said first pair of layers;

(e) ground layers of conductive material, being the ground planes of the stripline transmission lines referred to herein, placed on said lower side and said upper side of said dielectric layer and covering substantially all of said lower side and upper side except those areas of said sides lying adjacent to the area of and around the co-planar balun located on said inner plane of said layer of dielectric material;

(f) a first varactor diode, having a first terminal and a second terminal, mounted in an aperture in said dielectric layer, said aperture being positioned at said second end of a unique one of said first pair of layers, said first terminal being electrically connected to said second end of said first pair of layers and said second terminal being electrically connected to one of said ground layers;

(g) a second varactor diode matched to said first diode having a first terminal and a second terminal corresponding to said first terminal and said second terminal of said first diode, mounted in an aperture in said dielectric layer, said aperture being positioned at said second end of the other said first pair of layers, said first terminal of said second diode being electrically connected to said second end of the other said first pair of layers and said second terminal of said second diode being electrically connected to one of said ground layers; and (h) a second pair of parallel substantially rectangular layers of conductive material, being the inner conductors of a second pair of stripline transmission lines, mounted on said plane within said layer of dielectric material, being positioned near but substantially parallel to and aligned with said first pair of layers, and having substantially the same length, width, and thickness as one of said first pair of layers, for electromagnetically coupling a balanced signal from said first pair of stripline transmission lines and conveying it to said co-planar balun, each layer of said second pair having a first end and a second end and being electrically connected to said balun at said second end.

20. A microwave broad band frequency divider as recited in claim 19 further comprising means for applying a DC bias to each of said varactor diodes.

21. A microwave broad band frequency divider as recited in claim 19 wherein said input layer is electrically connected to said first pair of layers.

22. A microwave broad band frequency divider as recited in claim 19 wherein said parallel conductive layers of said co-planar balun are of electrical length about one-quarter of the wavelength of the output signals of the frequency divider.

23. A microwave broad band frequency divider comprising:

(a) an even number of matched microwave varactor diodes, each of said diodes having a unique first terminal and a unique second terminal;

(b) a plurality of terminated transmission lines equal in number to the number of diodes, each of said plurality of terminated transmission lines comprising a first conductor and a second conductor, one end of the first conductor and one end of the second conductor defining a first end of the said last mentioned transmission line, and the other end of the first conductor and the other end of the second conductor defining a second end of the last mentioned transmission line, a unique one of each of said diodes terminating said second end of a corresponding unique one of said transmission lines by connecting said first conductor at said second end to said first terminal of said diode and connecting said second conductor at said second end to said second terminal of said diode;

(c) an input transmission line coupled to said first end of all of said plurality of terminated transmission lines for conveying an input signal to said plurality of transmission lines;

(d) a balun electromagnetically coupled to said plurality of transmission lines, said balun extracting an unbalanced output signal from said plurality of transmission lines;

(e) transmission line means positioned in the vicinity of said plurality of transmission lines and electromagnetically coupled therewith and electrically connected to said balun for conveying a signal from said plurality of lines to said balun.

24. A microwave broad band frequency divider as recited in claim 23 wherein said transmission lines are formed of flat conductive strips propagating in the TEM mode.

* * * * *